United States Patent
Lo Giudice et al.

(10) Patent No.: US 8,437,196 B2
(45) Date of Patent: May 7, 2013

(54) SENSE-AMPLIFIER CIRCUIT FOR NON-VOLATILE MEMORIES THAT OPERATES AT LOW SUPPLY VOLTAGES

(75) Inventors: Gianbattista Lo Giudice, Pedara (IT); Antonino Conte, Tremestieri Etneo (IT); Mario Micciche, Agrigento (IT); Stefania Rinaldi, Aci Catena (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 274 days.

(21) Appl. No.: 12/883,072

(22) Filed: Sep. 15, 2010

(65) Prior Publication Data

US 2011/0069554 A1    Mar. 24, 2011

(30) Foreign Application Priority Data

Sep. 18, 2009 (EP) .................................... 09425360

(51) Int. Cl.
*G11C 16/06* (2006.01)
(52) U.S. Cl.
USPC ............................... 365/185.21; 365/185.25
(58) Field of Classification Search ............. 365/185.21, 365/203, 207, 208, 185.25
See application file for complete search history.

(56) References Cited

U.S. PATENT DOCUMENTS

| | | | |
|---|---|---|---|
| 5,581,511 A | 12/1996 | Gaultier et al. | |
| 7,483,306 B2 * | 1/2009 | Lin | 365/185.21 |
| 7,813,201 B2 * | 10/2010 | Fort et al. | 365/208 |
| 7,826,291 B2 * | 11/2010 | Bedarida et al. | 365/203 |

OTHER PUBLICATIONS

Conte, A. et al., "A High-Performance Very Low-Voltage Current Sense Amplifier for Nonvolatile Memories," IEEE Journal of Solid-State circuits 40(2):507-514, Feb. 2005.

* cited by examiner

*Primary Examiner* — Hoai V Ho
*Assistant Examiner* — Tri Hoang
(74) *Attorney, Agent, or Firm* — Seed IP Law Group PLLC

(57) ABSTRACT

A sense-amplifier circuit includes: a comparison stage that compares a cell current that flows in a memory cell and through an associated bitline, with a reference current, for supplying an output signal indicating the state of the memory cell; and a precharging stage, which supplies, during a precharging step prior to the comparison step, a precharging current to the bitline so as to charge a capacitance thereof. The comparison stage includes a first comparison transistor and by a second comparison transistor, which are coupled in current-mirror configuration respectively to a first differential output and to a second differential output, through which a biasing current flows. The precharging stage diverts, during the precharging step, the biasing current towards the bitline as precharging current, and allows, during the comparison step, passage of part of the biasing current towards the first differential output, enabling operation of the current mirror.

25 Claims, 7 Drawing Sheets

SENSE-AMPLIFIER CIRCUIT FOR NON-VOLATILE MEMORIES THAT OPERATES AT LOW SUPPLY VOLTAGES

BACKGROUND

1. Technical Field

The present disclosure relates to a sense-amplifier circuit for non-volatile memories that operates at low supply voltages; in particular, the following description will make specific reference, without this implying any loss of generality, to the use of this sense-amplifier circuit in a non-volatile EEPROM (Electrically Erasable and Programmable Read-Only Memory) of the type commonly used in a wide range of applications, amongst which automotive devices, telecommunications devices (for example, mobile phones, pagers), portable consumer devices (for example, smart cards, SIMs, video cameras and photographic cameras, portable computers) and data-processing devices in general (for example, personal computers).

2. Description of the Related Art

In a known way, a non-volatile memory made with semiconductor technology comprises a memory array constituted by a plurality of memory cells, arranged aligned in rows and columns and connected to appropriate selection and biasing elements and stages, which enable programming (or writing), erasing and reading thereof in respective operating conditions.

In particular, memory cells belonging to one and the same column have drain terminals connected (directly or selectively through respective selection switches) to one and the same bitline, i.e., a metal connection line that extends throughout the column and that enables biasing thereof at the desired voltages.

Programmed memory cells have a different threshold voltage from erased memory cells; the operation of reading (or verifying) of the contents of the memory cells thus envisages sensing of the current circulating in the same memory cells, in the presence of appropriate biasing conditions (which depend, among other things, upon the technology used).

For example, in the case of a non-volatile EEPROM, the memory cells are constituted by floating-gate transistors, and the erasing and programming operations envisage the injection and, respectively, the extraction of electrical charges into/from the floating-gate terminal of the floating-gate transistor via the tunnel effect (Fowler-Nordheim effect). An EEPROM cell has different threshold voltages according to whether it is in the programmed state or in the erased state (in particular it has a lower threshold voltage when programmed) so that, in the same biasing conditions, it supplies different reading currents according to its state (programmed or erased).

The reading (or verifying) operation is performed by means of a purposely provided sense-amplifier circuit, configured so as to compare the value of the current circulating in an appropriately biased memory cell with a reference current. In particular, the reference current can be the current circulating through a reference (or "virgin") cell, made with the same technology as the memory cells, or, alternatively, be supplied by an appropriate current-generator circuit (for example, of the current-mirror type, operating on the basis of a suitably generated reference voltage, for example a bandgap voltage).

The sense-amplifier circuit is further configured so as to supply to the drain terminals of the memory cells subjected to reading (or verification of their contents) the biasing voltages, and thus so as to be able to drive, or precharge, the capacitive load constituted by the corresponding bitlines (which have in fact a capacitance proportional to their extension along the columns of the memory array).

In particular, the speed with which the sense-amplifier circuit is able to perform the current comparison (and hence switch high, or low, according to the relation between the current circulating in the memory cell and the reference cell) has a significant effect on the time for accessing the memory during reading.

In order to reduce the levels of consumption and the size of the electronic devices (for example, portable devices operating with a battery), there is the tendency to use low supply voltages and increasingly more scaled technologies (for example, CMOS technologies with a channel length of 90 nm).

In particular, problems arise in the integration of memory cells, for example EEPROM cells, in markedly scaled CMOS technologies, due to the need, for LV (low-voltage) transistors to operate at ever-lower voltages (for example, voltages lower than or equal to 1.35 or 1.2 V) so as to protect the gate oxides (which have thicknesses as low as approximately 20 Å).

The external supply voltages, on the other hand, albeit low in order to reduce consumption levels, are not scaled accordingly, necessitating the use of voltage converters (the so-called "voltage down converters") for biasing the LV transistors in the memory.

If on the one hand these converters enable separation of the external supply from the one internal to the memory, on the other hand, at the peaks of current absorption by the internal circuitry, they are subject to inevitable drops, which may even be of the order of some hundreds of millivolts.

Consequently, if the converter tends to regulate the internal supply voltage to a value equal, for example, to 1.2 V (a typical operating voltage for 90-nm CMOS transistors), it is inevitable that, on account of the drops, the effective value of the voltage can even reach 1 V.

The foregoing involves considerable difficulties in the design of the memories, which on the one hand require high operating voltages in order to modify and read the contents of the memory cells, and on the other extremely low and stable supply voltages in order to bias the internal LV components.

In particular, design of the sense amplifiers is important in order to satisfy the following:
 being able to drive capacitive loads, even of a high value;
 being able to discriminate minimum differences of current (for example, in the order of 1 or 2 µA);
 operating at low internal supply voltages (for example, lower than 1.35 V); and
 performing reading in extremely short times (for example, in the region of 30 ns or less).

Even though a wide range of sense-amplifier architectures is currently known, some of which are also able to operate at low supply voltages, none of them has proven altogether satisfactory as regards the aforesaid when the internal supply voltages drop to values of 1 V or less.

In particular, the document "A high performance very low voltage current sense-amplifier circuit for Non volatile Memories", IEEE JSSC, vol. 40, No. 2, February 2005, discloses the architecture of a sense-amplifier circuit that is able to operate at internal supply voltages of as low as 1.35 V.

This circuit, which is depicted in FIG. 1, is generally based (see the aforesaid document for further details) on a differential architecture for the comparison between the current circulating in a memory cell (designated by $I_c$), through the corresponding bitline BL, and a reference current $I_{ref}$. A voltage comparison is performed (by means of an amplifier stage formed by MOS transistors M15-M20) after an I/V (current/ voltage) conversion starting from the aforesaid currents, and only after a precharging phase of the bitline capacitance has terminated (in such a way that voltage values are stabilized); an output signal $S_{out}$ is thus generated.

In particular, a comparison stage (representing the core of the sense-amplifier circuit) is provided, made by a current mirror formed by NMOS comparison transistors M1, M2, which receive the currents to be compared $I_c$ and $I_{ref}$, and are appropriately biased by a current mirror formed by PMOS transistors M4-M6 (which in turn receives a current to be mirrored from an NMOS transistor M3 having on the gate terminal a pre-set voltage $V_{REF}$, equal to a desired voltage for the bitline BL, with the memory cell not connected).

The circuit proves suited to operating at low voltages thanks to the presence of a precharging stage, constituted by PMOS transistors M12, M13 and by NMOS transistors M10, M11 in current-mirror configuration, which is able to supply a further supplement of current to the bitline BL selected during the phase of precharging of the line capacitance (in particular, the amount of supplementary current supplied to the bitline is modulated by the voltage present on the same bitline, via the NMOS transistor M14, which "turns off" the mirror when the bitline BL reaches a desired precharge level, when NMOS comparison transistors M1, M2 are turned on and the corresponding current mirror is enabled).

A slew-rate-increasing stage is moreover provided for increasing the switching speed of the sense-amplifier circuit, by increasing the biasing current with which the capacitive load of the bitline is precharged. This stage is constituted by NMOS transistors M7-M8, which, when biased by an appropriate current, increase by a mirroring factor (being coupled to NMOS transistor M3), the biasing current for the bitline BL during the precharging phase; NMOS transistor M9 causes this current increase action to be active only during the precharging phase, until the voltage on the bitline reaches a pre-set threshold value such as to turn on the comparison NMOS transistors M1, M2.

The circuit suffers, however, from a drawback that may limit its reading speed when very low voltages are used (for example, lower than 1.35 V), owing to the fact that the initial current peak may be insufficient when the current mirrors, on which the control and increase of the precharging current are based, start to suffer from the so-called "Early effect" (during the precharging phase, the current on the bitline is in fact supplied entirely by the same current mirrors).

Consequently, this circuit does not offer an adequate control of the bitline precharge for internal supply voltages in the region of, or lower than, 1 V, and moreover has access times that cannot be lower than approximately 30 ns for the same values of the internal supply voltage.

BRIEF SUMMARY

One embodiment of the present disclosure overcomes the problems and the limitations of circuits of a known type, and in particular provides a sense-amplifier circuit that is functional also for very low internal supply voltages and that has short reading times.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
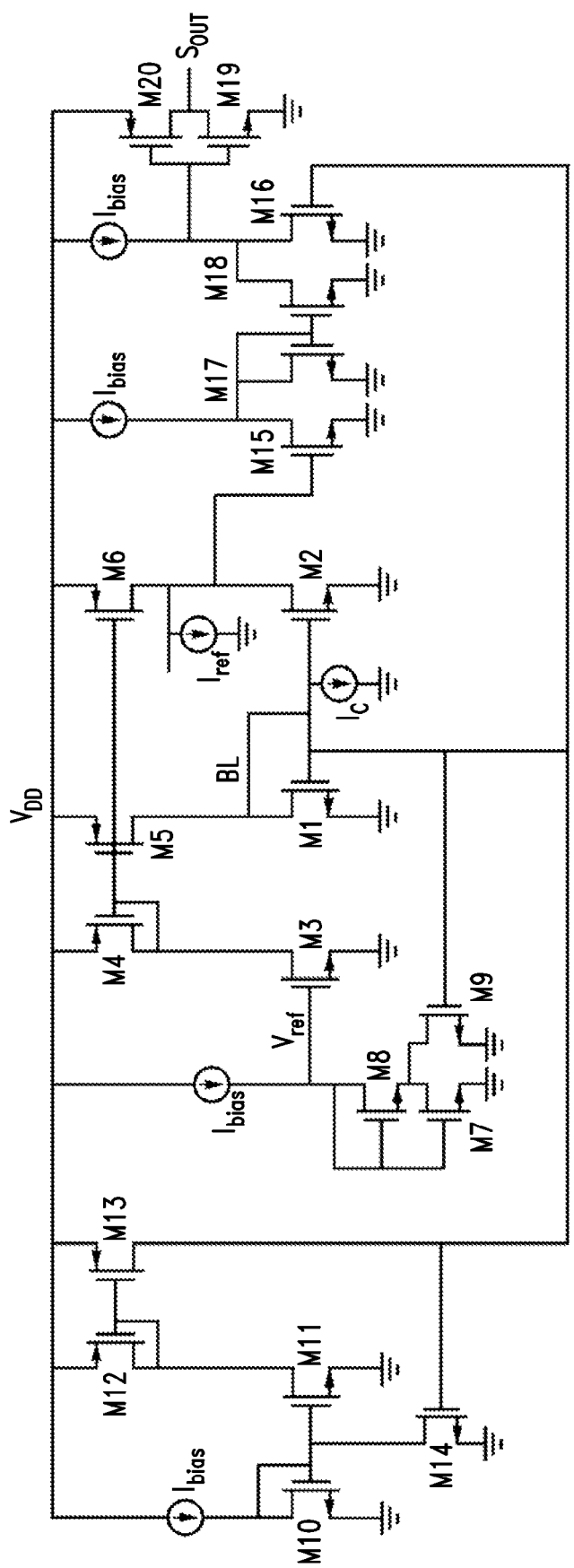
FIG. 1 shows the circuit diagram of a sense-amplifier circuit of a known type.
Figure 2:
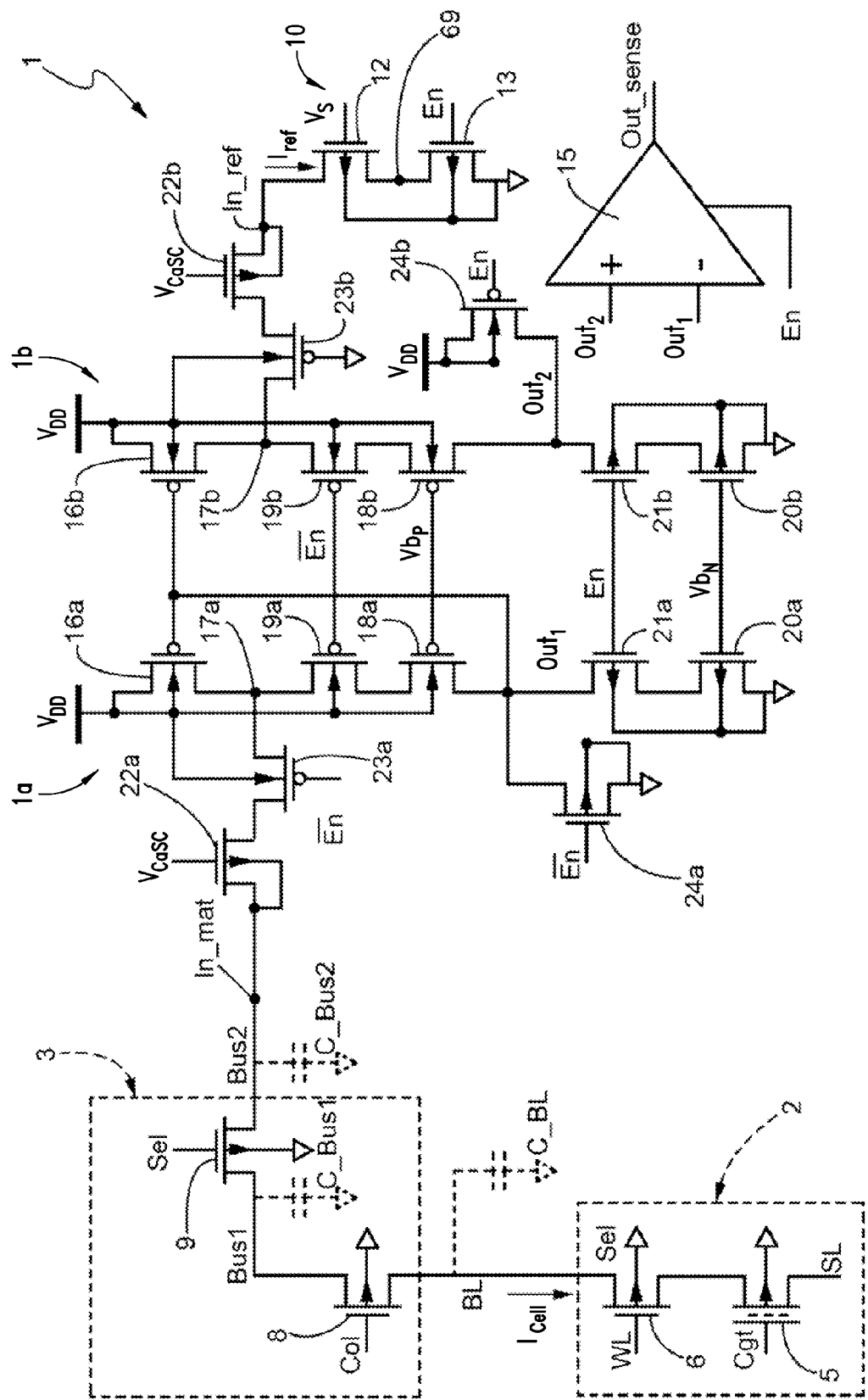
FIG. 2 shows the circuit diagram of a sense-amplifier circuit according to an embodiment of the present disclosure.

As illustrated in FIG. 2, a sense-amplifier circuit 1 for a non-volatile memory device has: an array-side input IN_mat, that is to receive a cell current $I_{cell}$ from a memory cell 2 appropriately addressed and selected; a reference-side input IN_ref, that is to receive a reference current $I_{ref}$ of appropriate value (for example, 10 µA); and a sense output Out_sense, on which it supplies a value indicating the contents of the memory cell 2 (in particular a voltage that switches between a high value and a low value).

The sense-amplifier circuit 1 is configured so as to compare in a differential way the cell current $I_{cell}$ and the reference current $I_{ref}$ and to supply on the sense output Out_sense a value depending upon the result of the comparison (for example, a high value when the cell current $I_{cell}$ is higher than the reference current $I_{ref}$, a condition indicative of a programmed memory cell 2, and a low value in the opposite case, a condition indicative of an erased memory cell 2).

The array-side input IN_mat can be selectively connected to the memory array, and in particular to the memory cell 2 and to the corresponding bitline BL (through which the cell current $I_{cell}$ flows), via a column-decoder stage 3.

The memory cell 2, in particular of an EEPROM type, comprises a floating-gate transistor 5, having, in a way in itself known, a gate terminal selectively connectable to a gate-control line Cgt of the memory array, a source terminal connected to a source line SL of the same memory array, and a drain terminal selectively connectable to the corresponding bitline BL by means of a selection switch 6, in particular an NMOS transistor having a source terminal connected to the drain terminal of the memory cell 2, a drain terminal connected to the bitline BL, and a gate terminal connected to a wordline WL of the memory array.

The column decoder 3 comprises, associated with the bitline BL of the memory cell 2, a bit latch formed by: a first selection switch 8, controlled by a column-selection signal Col and connected between the bitline BL and an internal bus Bus1 in the column decoder 3; and a second selection switch 9, controlled by a selection signal Sel and connected between the internal bus Bus1 and an external bus Bus2, which is in turn connected to the array-side input IN_mat of the sense-amplifier circuit 1.

In particular, FIG. 2 shows the parasitic capacitances intervening in the path of the cell current $I_{cell}$ from the memory cell 2 to the sense-amplifier circuit 1: a bitline capacitance C_BL, associated with the bitline BL; a first bus capacitance C_bus1, associated with the internal bus Bus1; and a second bus capacitance C_bus2, associated with the external bus Bus2.

The sense-amplifier circuit 1 is configured so as to bias the drain of the memory cell 2 at the desired voltage level before it performs reading of the contents of the same memory cell 2; such biasing leads in particular to precharging of all the parasitic capacitances that intervene on the bitlines and bus lines, and hence of the set of the bitline capacitance C_BL and of the first and second bus capacitances C_bus1, C_bus2.

The reference current $I_{ref}$ supplied to the reference-side input In_ref of the sense-amplifier circuit 1 can be the current circulating in a reference cell (here not illustrated), or else, as in the case illustrated in FIG. 2, be generated by a current generator 10.

The current generator 10, of which only an output stage is illustrated in FIG. 2, is, for example, constituted by a current-mirror circuit that generates the reference current $I_{ref}$ starting from a stable-voltage reference (for example, a band-gap reference). In particular, the current generator 10 includes a mirror transistor 12, of an NMOS type, having a first conduction terminal connected to the reference-side input In_ref of the sense-amplifier circuit 1, on which it supplies the reference current $I_{ref}$, and a second conduction terminal connected to ground via a first enabling switch 13, having a control terminal that receives an enabling signal En (generated by an appropriate timing circuit of the memory device); the mirror transistor 12 moreover has, on its gate terminal, a mirror voltage Vs, of a stable value so as to generate a reference current, which is in turn stable.

The sense-amplifier circuit 1 has an altogether symmetrical structure, comprising two substantially specular circuit branches: a first circuit branch 1a, array side, which defines the array-side input In_mat, and a first differential output Out$_1$; and a second circuit branch 1b, reference side, which defines the reference-side input In_ref, and a second differential output Out$_2$.

The sense-amplifier circuit 1 further comprises a comparator 15, having a first (negative) input and a second (positive) input, connected, respectively, to the first and second differential outputs Out$_1$, Out$_2$, and connected at its output to the sense output Out_sense. The comparator 15, provided by an operational amplifier, also receives the enabling signal En.

In greater detail, each circuit branch 1a, 1b comprises a comparison transistor 16a, 16b, in particular of a PMOS type, having a first current-conduction terminal connected to a line set at an internal supply voltage $V_{DD}$ and a second current-conduction terminal connected to an intermediate node 17a, 17b; the control terminals of the comparison transistors 16a, 16b of the first and second circuit branches 1a, 1b are moreover connected to one another and to the first differential output Out$_1$. The internal supply voltage $V_{DD}$ has values in the region of 1 V, or less, and is, for example, generated via a voltage converter of the down-converter type (not illustrated), starting from an external supply voltage that supplies the memory device, for example comprised between 1.8 V and 5V.

Each circuit branch 1a, 1b further comprises a current-steering transistor 18a, 18b, in particular of a PMOS type, having a first current-conduction terminal selectively connectable to the intermediate node 17a, 17b via a second enabling switch 19a, 19b and a second current-conduction terminal connected to the first (or second, according to the circuit branch 1a, 1b) differential output Out$_1$ (Out$_2$); the control terminals of the current-steering transistors 18a, 18b of the first and second circuit branches 1a, 1b are connected to one another and set at a first biasing voltage Vb$_P$ (generated as described in detail hereinafter).

The second enabling switch 19a, 19b is constituted by a PMOS transistor connected between the intermediate node 17a, 17b and the first current-conduction terminal of the current-steering transistor 18a, 18b; the control terminals of the PMOS transistors of the second enabling switches 19a, 19b are connected to one another and receive a negated enabling signal $\overline{En}$, i.e., a negated version of the enabling signal En.

Each circuit branch 1a, 1b further comprises a biasing transistor 20a, 20b, in particular of an NMOS type, having a first current-conduction terminal selectively connectable to the first differential output Out$_1$ or the second differential output Out$_2$ via a third enabling switch 21a, 21b, and a second current-conduction terminal connected to ground; the control terminals of the biasing transistors 20a, 20b of the first and second circuit branches 1a, 1b are connected to one another and set at a second biasing voltage Vb$_N$ (generated as described in detail hereinafter).

The third enabling switch 21a, 21b is constituted by an NMOS transistor connected between the first (or second) differential output Out$_1$ (Out$_2$) and the first current-conduction terminal of the biasing transistor 20a, 20b; the control terminals of the NMOS transistors of the first and second circuit branches 1a, 1b are connected to one another and receive the enabling signal En.

Each circuit branch 1a, 1b further comprises a precharging transistor 22a, 22b, in particular of an NMOS type, having a first current-conduction terminal selectively connectable to the intermediate node 17a, 17b via a fourth enabling switch 23a, 23b, and a second current-conduction terminal connected to the array-side input In_mat (or to the reference-side input In_ref, in the case of the second circuit branch 1b); the control terminals of the precharging transistors 22a, 22b of the first and second circuit branches 1a, 1b are moreover biased at a precharging voltage $V_{casc}$ (generated as described in detail hereinafter).

The fourth enabling switch 23a, 23b is constituted by a PMOS transistor connected between the intermediate node 17a, 17b and the first current-conduction terminal of the precharging transistor 22a, 22b; the control terminal of the enabling switch 23a of the first circuit branch 1a moreover receives the negated enabling signal $\overline{En}$, whilst the control terminal of the enabling switch 23b of the second circuit branch 1b is connected to ground.

The first and second circuit branches 1a, 1b moreover comprise a fifth enabling switch 24a, 24b. In particular, the fifth enabling switch 24a of the first circuit branch 1a, of an NMOS type, is connected between the first differential output Out$_1$ and ground, and receives at its control terminal the negated enabling signal $\overline{En}$. The fifth enabling switch 24b of the second circuit branch 1b, of a PMOS type, is connected between the second differential output Out$_2$ and the line set at the internal supply voltage $V_{DD}$, and receives at its control terminal the enabling signal En.

In general, in the architecture of the sense-amplifier circuit 1 it is possible to identify: a comparison stage, that operates according to a differential current-mirror scheme and is formed by the comparison transistors 16a, 16b and by the comparator 15; a biasing stage, designed to supply, as will be described in detail hereinafter, the biasing currents of the circuit and formed, inter alia, by the biasing transistors 20a, 20b; a precharging stage, which is designed to supply, as will be described in detail, the currents for precharging of the bitline BL and biasing of the memory cell 2 and is formed by the current-steering transistors 18a, 18b and by the precharging transistors 22a-22b; and an enabling stage, which is designed to enable and time the operation of the circuit and is formed by the enabling switches 13, 19a-19b, 21a-21b, 23a-23b and 24a-24b.

Operation of the sense-amplifier circuit 1 is now described, which envisages, once an access in reading (or verifying) to the memory array occurs, a step of precharging of the bitline BL associated with the memory cell 2 each time addressed, followed by the proper reading step (via a current comparison) of the contents of the memory cell 2.

In detail, access in reading (or verifying) to a memory cell 2 first envisages, in a per-se known manner, address decoding, by appropriate row-decoding and column-decoding circuits, and generation of the appropriate row-selection and column-selection signals that will enable addressing of the same memory cell 2.

In an initial state in which the enabling signal EN is at a low value and the negated enabling signal $\overline{En}$ is at a high value, the first and second differential outputs $Out_1$, $Out_2$ are kept respectively at ground and at the internal supply voltage VDD. Once a time deemed sufficient for addressing the memory cell 2 (i.e., sufficient for the values of the selection signals to be stable) has elapsed, the sense-amplifier circuit 1 is turned on via the enabling signal EN and the negated enabling signal $\overline{En}$; in particular, the enabling signal EN is brought to a high value, whilst the negated enabling signal $\overline{En}$ is brought to a low value. Consequently, the first and second differential outputs $Out_1$, $Out_2$ become free to evolve towards different voltage values, so that current can flow in the circuit branches 1a, 1b (in this step, all the enabling switches 13, 19a-19b, 21a-21b, and 23a-23b are closed, except for the fifth enabling switches 24a-24b).

In the initial switching-on step, the current-steering transistor 18a is instead off, given that also the bitline BL and the internal bus Bus1 and the external bus Bus2 are initially pre-set to ground. In particular, the current-steering transistor 18a will not conduct current as long as its source terminal is not sufficiently higher than the first biasing voltage $Vb_P$. In this regard, the first biasing voltage $Vb_P$ is generated so as to have a value equal to the internal supply voltage $V_{DD}$ reduced by a pre-set threshold.

Until this condition arises, the first differential output $Out_1$ hence remains at the low value, through the current biasing towards ground supplied by biasing transistor 20a. Furthermore, all the current delivered by the comparison transistor 16a, which is consequently biased in a state of marked conduction (the internal supply voltage $V_{DD}$ is present between the gate and source terminals), flows towards the bitline BL, thus precharging the parasitic line capacitances (the current mirror for current comparison is consequently not active). In particular, the precharging transistor 22a enables this passage of precharging current, being biased in the state of conduction by the value of the precharging voltage $V_{casc}$ present on the corresponding gate terminal. The precharging current is advantageously higher than the current for biasing the circuit branches of the sense-amplifier circuit 1, so that, advantageously, the precharging step can be rendered fast by appropriately sizing the comparison transistor 16a and the precharging transistor 22a.

This precharging step (and the corresponding exclusive flow of current towards the bitline BL) continues until the voltage of the same bitline BL is charged up to a voltage level such as to turn on the current-steering transistor 18a (namely, until the voltage of the bitline BL reaches, and then exceeds, the value of the first biasing voltage $Vb_P$). After switching-on of the current-steering transistor 18a, part of the current supplied by the comparison transistor 16a starts to flow towards the same current-steering transistor 18a so that a progressive increase of the voltage of the first differential output $Out_1$ occurs; the voltage of the bitline BL continues to increase (even though with a lower rate of increase given the lower flow of current), in particular up to a desired level of biasing voltage required for the reading operation. This biasing voltage, for example approximately equal to 0.7 V, is determined by the value of the precharging voltage $V_{casc}$ present on the gate terminal of the precharging transistor 22a, which operates in cascode configuration.

At the end of the precharging step (i.e., when the voltage of the bitline BL has stabilized at the desired value), the sense-amplifier circuit 1 performs the comparison between the cell current $I_{cell}$ and the reference current $I_{ref}$ according to a differential scheme. In particular, it is to be noted that, upon closing of the current-steering transistor 18a, a current-mirror-connected comparison stage is created, in which the first differential output $Out_1$ constitutes the drain terminal of the comparison transistor 16a of the first circuit branch 1a and the second differential output $Out_2$ constitutes the drain terminal of the comparison transistor 16b of the second circuit branch 1b, and the voltages present on the differential outputs $Out_1$, $Out_2$ are correlated to the values to be compared of the cell current $I_{cell}$ and reference current $I_{ref}$.

Consequently, given the symmetry between the first and second circuit branches 1a, 1b, only in the case where the currents to be compared are exactly equal, the differential outputs $Out_1$ and $Out_2$ go to the same voltage level. If instead the cell current $I_{cell}$ is higher than the reference current $I_{ref}$ (in so far as the memory cell 2 is in the programmed state), the circuit configuration causes the voltage of the first differential output $Out_1$ to go to a value lower than the voltage of the second differential output $Out_2$, and hence the comparator 15 to bring the sense output Out_sense to the high value. Instead, if the cell current $I_{cell}$ is lower than the reference current $I_{ref}$ (in so far as the memory cell 2 is in the erased state), the circuit configuration causes the voltage of the first differential output $Out_1$ to go to a value higher than the voltage of the second differential output $Out_2$, and hence the comparator 15 to switch the sense output Out_sense to the low value. In either case, the circuit architecture of the sense-amplifier circuit 1 causes the difference between the currents to be compared to bring about switching of the comparator 15, consequently enabling reading of the contents of the memory cell 2.

Figure 3:
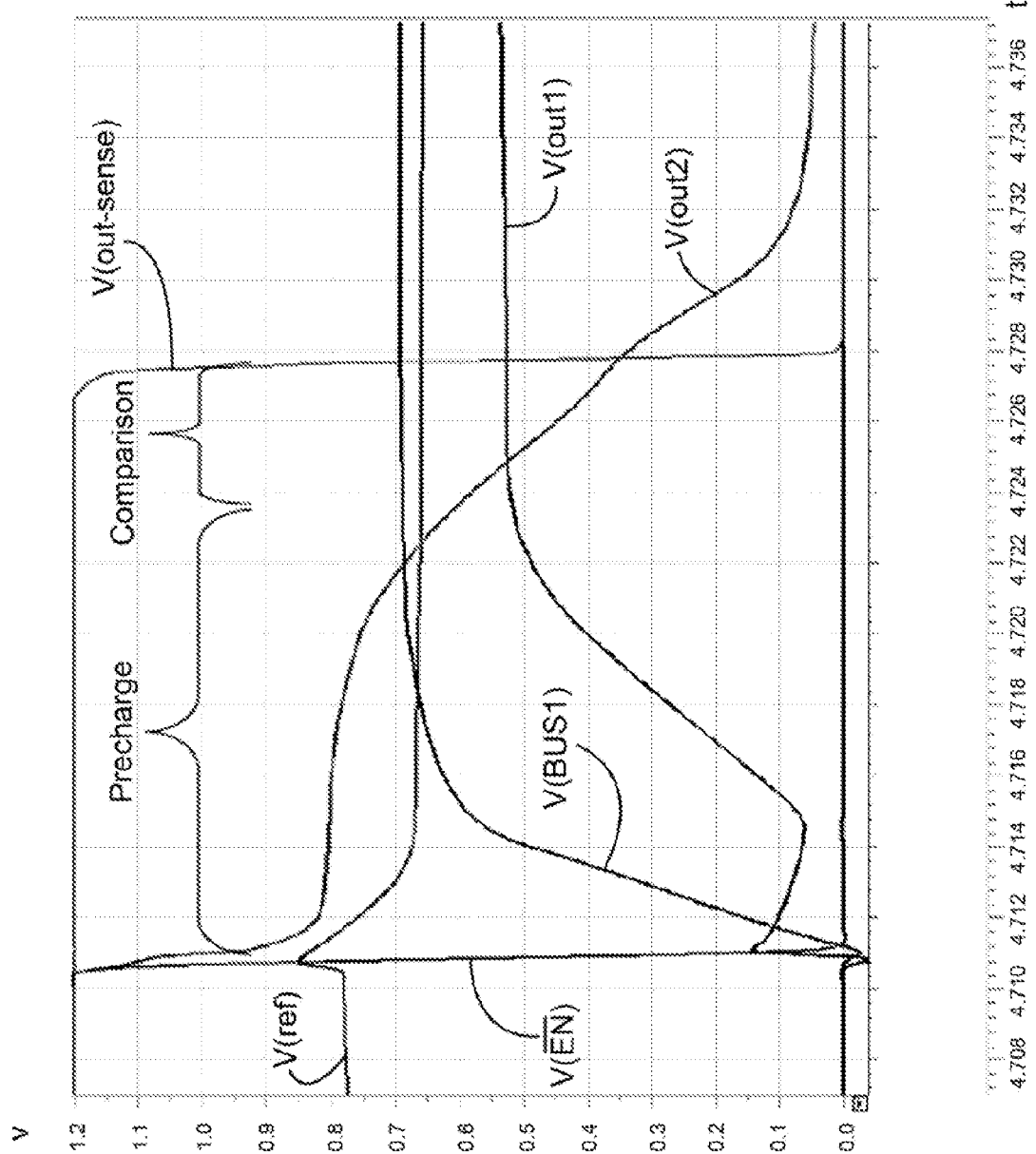
FIG. 3 shows plots of signals present in use in the sense-amplifier circuit of FIG. 2.

The behavior of the sense-amplifier circuit 1 is exemplified by the diagrams of FIG. 3, depicting, during the precharging step and the subsequent comparison step, the plots of: the voltages on the first differential output V(Out1) and second differential output V(Out2); the negated enabling signal V($\overline{En}$); the sense output V(Out_sense); the reference voltage V(ref) on the reference-side input IN_ref; and the voltage on the internal bus V(Bus1). In particular, it is evident that the sense output Out_sense switches (from a high value to a low value) following upon the comparison step, after the reference voltage V(ref) and the voltage on the internal bus V(Bus1) have settled, during the precharging step, to the desired values (as a function of the applied biasing) and the differential outputs have been able to evolve as a function of the difference between the currents to be compared. Furthermore, it may be noted that, advantageously, the read operations (precharging and comparison) require a time of less than approximately 20 ns.

Figure 4:
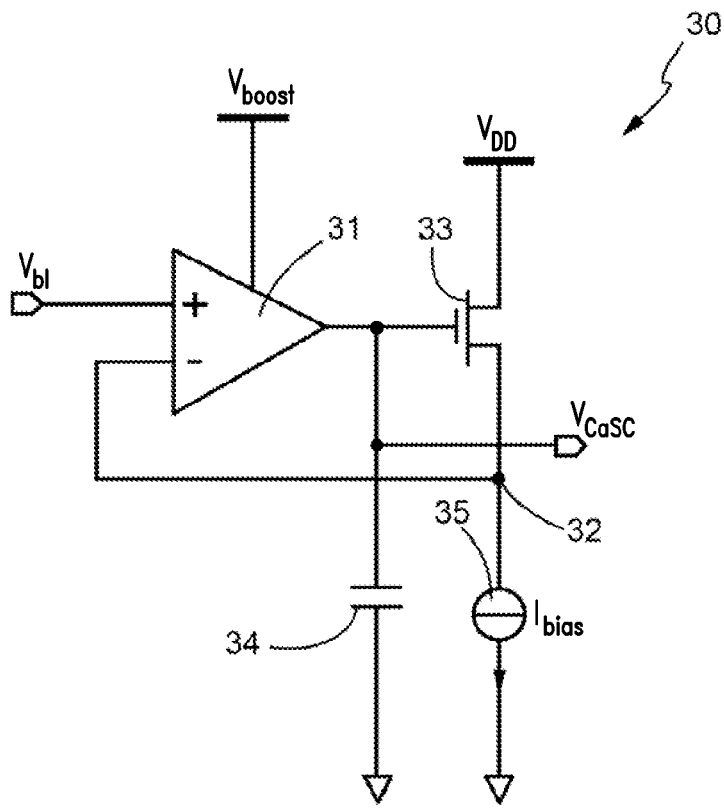
FIGS. 4-6 show circuit diagrams of biasing stages for the sense-amplifier circuit of FIG. 2.

With reference to FIG. 4, a first biasing circuit 30 is now described, designed to generate the precharging voltage $V_{casc}$ for the sense-amplifier circuit 1.

In particular, the first biasing circuit 30 comprises: an operational amplifier 31, supplied by a boosted voltage $V_{boost}$ (higher than the internal supply voltage $V_{DD}$), which receives on a non-inverting input a bitline voltage $V_{bl}$, i.e., a biasing voltage having a desired value for the bitline BL (for example, 650 mV), and has an inverting input connected to an intermediate node 32 and an output on which it supplies the precharging voltage $V_{casc}$; and a first replica transistor 33, of an NMOS type, having the same electrical characteristics as the precharging transistor 22a, 22b, and having its gate terminal connected to the output of the operational amplifier 31, its drain terminal connected to the line set at the internal supply voltage $V_{DD}$, and its source terminal connected to the intermediate node 32.

The first biasing circuit 30 further comprises: a first coupling capacitor 34, connected between the output of the operational amplifier 31 and ground; and a first current generator 35, connected between the intermediate node 32 and ground, and supplying a first biasing current $I_{bias}$, equal to the reference current $I_{ref}$.

In use, the first biasing circuit 30 generates a precharging voltage $V_{casc}$ such that, when it is applied to the gate terminal of the first replica transistor 33, a current equal to the reference current $I_{ref}$ flows through the same transistor, with the source terminal regulated at the bitline voltage $V_{bl}$. This precharging voltage $V_{casc}$, supplied to the gate terminal of the precharging transistor 22a (and, by symmetry, to the gate terminal of the precharging transistor 22b), hence enables biasing of the drain terminal of the memory cell 2 at the desired biasing voltage, i.e., the bitline voltage $V_{bl}$, for the operations of reading of its contents (when a current equal to the reference current $I_{ref}$ flows through the same memory cell 2).

Figure 5:
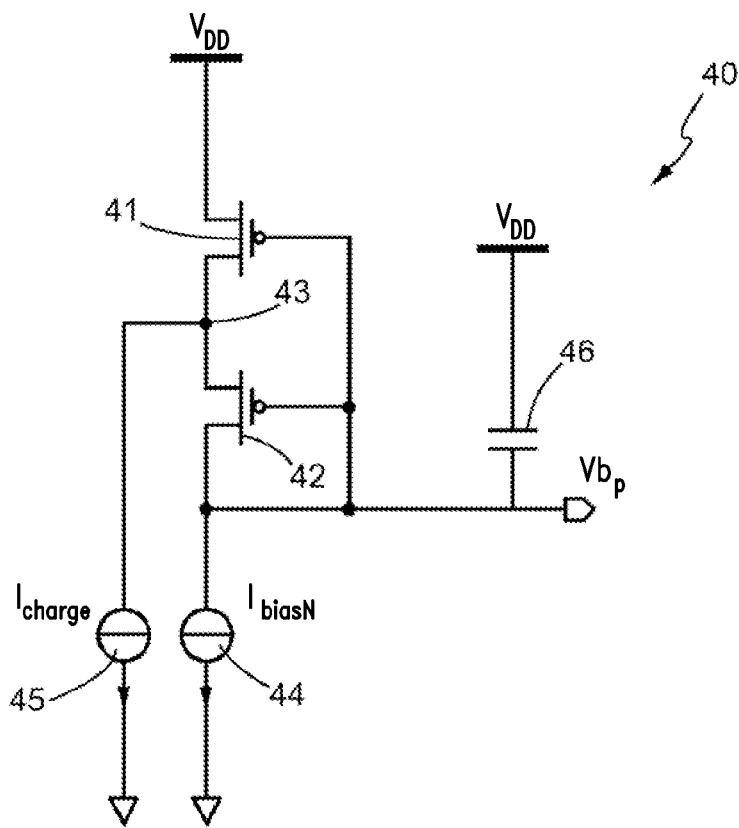

FIG. 5 shows a second biasing circuit 40, designed to generate the first biasing voltage $Vb_P$ for the sense-amplifier circuit 1.

In particular, the second biasing circuit 40 comprises a second replica transistor 41 and a third replica transistor 42, having the same electrical characteristics, respectively, as the comparison transistor 16a, 16b and as the current-steering transistor 18a, 18b, connected in series. In particular, the second replica transistor 41 has its source terminal connected to the line set at the internal supply voltage $V_{DD}$, its drain terminal connected to an intermediate node 43, and its gate terminal connected to the gate terminal of the third replica transistor 42. The third replica transistor 42 in turn has its source terminal connected to the intermediate node 43, its drain terminal connected to a second current generator 44, supplying a second biasing current $I_{biasN}$ of appropriate value (for example, 8 µA), and its gate terminal connected to its drain terminal (for a diode connection), on which the first biasing voltage $Vb_P$ is generated.

The second biasing circuit 40 further comprises a third current generator 45, connected between the intermediate node 43 and ground, which extracts a third biasing current $I_{charge}$ from the same intermediate node 43, and a second coupling capacitor 46, connected between the gate terminal of the third replica transistor 42 (on which the first biasing voltage $Vb_P$ is present) and the line set at the internal supply voltage $V_{DD}$.

In use, the second biasing circuit 40 generates the first biasing voltage $Vb_P$, with the third biasing current $I_{charge}$ assuming a value equal to the reference current $I_{ref}$, which flows through the memory cell 2 in the neighborhood of the equilibrium condition during the comparison step. In particular, the first biasing voltage $Vb_P$ has a value equal to the internal supply voltage $V_{DD}$ decreased by an appropriate threshold voltage, which enables the passage of the sum of the second and third biasing currents ($I_{charge}+I_{biasN}$) through the second replica transistor 41 and of the second biasing current $I_{biasN}$ through the third replica transistor 42.

Figure 6:
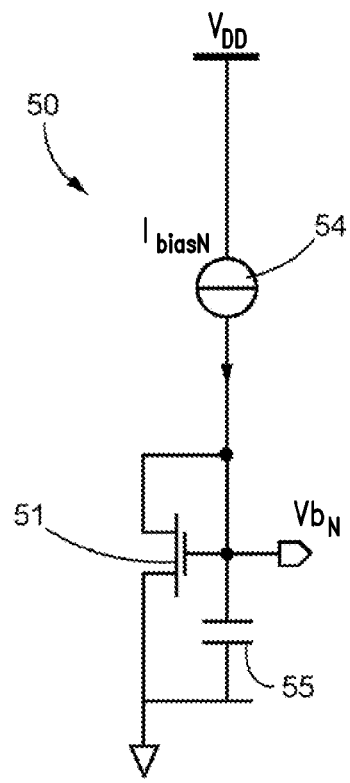

With reference to FIG. 6, a third biasing circuit 50, designed to generate the second biasing voltage $Vb_N$ for the sense-amplifier circuit 1, comprises a fourth replica transistor 51, which has its drain terminal connected to a fourth current generator 54 generating the second biasing current $I_{biasN}$, its source terminal connected to ground, and its gate terminal connected to its drain terminal (diode connection); the second biasing voltage $Vb_N$ is generated on the drain terminal (as illustrated in FIG. 6, the terminal of the fourth current generator 54 that is not connected to the fourth replica transistor 51 is connected to the line set at the internal supply voltage $V_{DD}$).

The third biasing circuit 50 further comprises a third coupling capacitor 55, connected between the gate terminal of the fourth replica transistor 51 and ground.

In use, the second biasing current $I_{biasN}$, which determines the biasing voltage for the biasing transistors 21a, 21b, of an NMOS type, is chosen in such a way as to bias the circuit branches 1a, 1b of the sense-amplifier circuit 1 with a current that is not excessively high (to limit the current consumption thereof), but in any case such as to render sufficiently fast the evolution of the differential outputs $Out_1$ and $Out_2$ (this current is, for example, equal to 8 µA).

An appropriate sizing of the various transistors of which the sense-amplifier circuit 1 is made up enables a small statistical variation of the switching time of the sense output Out_sense of the comparator 15 to be obtained.

The switching time of this type of circuits increases in fact as the difference between the cell current $I_{cell}$ and the reference current $I_{ref}$ decreases; in addition, also the statistical spread due to the mismatch between the circuit components (only ideally perfectly symmetrical) increases as the differences between the currents to be compared decrease.

Figure 7:
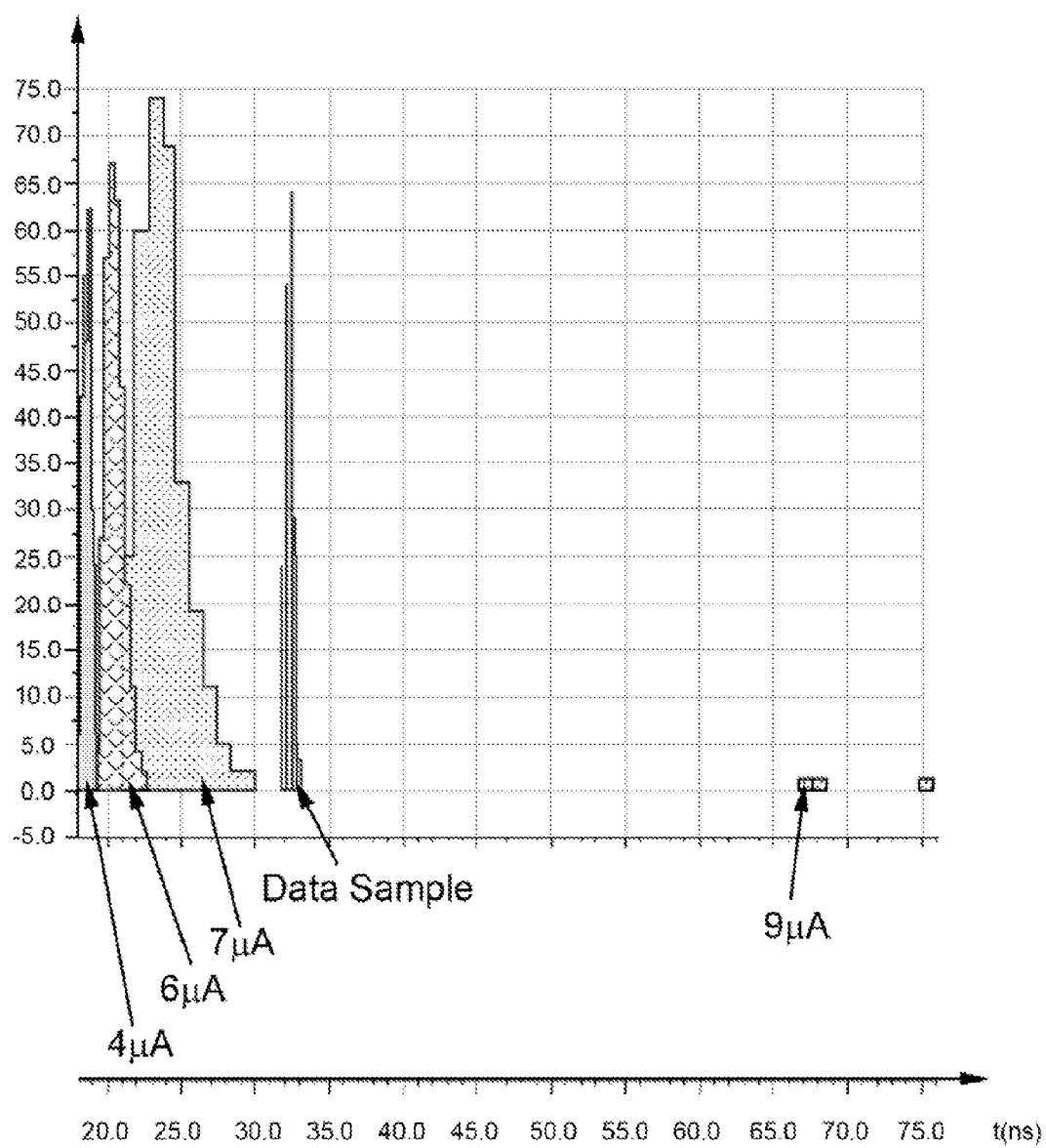
FIG. 7 shows histograms relating to switching times of the sense-amplifier circuit of FIG. 2.

In this regard, FIG. 7 shows histograms corresponding to the switching time of the sense output Out_sense for memory cells 2, in which currents from 4 µA to 6 µA flow (assuming that a reference current $I_{ref}$ of 8 µA is used).

Even for differences of just 1 µA (cell current $I_{cell}$ equal to 7 µA and reference current $I_{ref}$ equal to 8 µA) a standard deviation of the switching time of approximately just 1.6 ns occurs. Furthermore, a sampling time (designated by "Data Sample") of appropriate length (less than 35 ns) enables correct reading of all the memory cells 2 (also the ones with a cell current $I_{cell}$ of 7 µA); in addition, wrong switchings of the sense-amplifier circuit, when it reads memory cells with higher cell currents and erroneously switches due to mismatches with a very long switching time (longer than the sampling time), are not considered.

Figure 8:
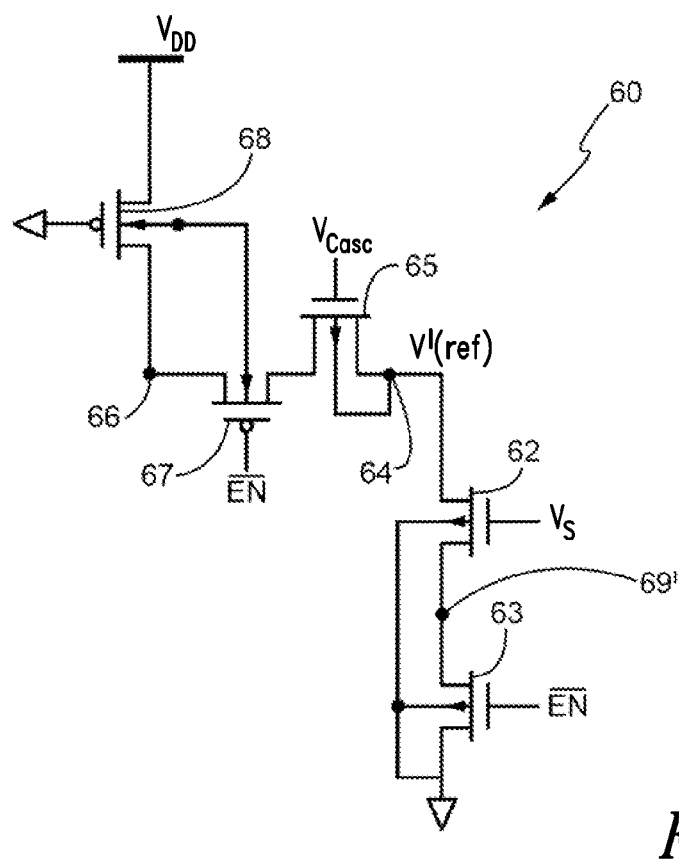
FIG. 8 shows a circuit diagram of a noise-compensation stage for the sense-amplifier circuit of FIG. 2.

A further aspect of the present disclosure envisages improvement of the sense-amplifier circuit described previously, by introduction of a noise-compensation stage, illustrated in FIG. 8 and designated as a whole by 60.

At switching-on of the sense-amplifier circuit 1, the reference voltage V(ref) on the reference-side input In_ref in the second circuit branch 1b, as illustrated in FIG. 3, undergoes a sudden variation, due to the presence of a capacitive load lower than that of the first circuit branch 1a (which is instead affected by the bus and bitline capacitances). On account of the parasitic capacitance between the drain and source terminals and the gate terminal of the mirror transistor 12, an injection of charge and a significant contribution of noise on the mirror voltage Vs on the gate terminal may consequently occur; in turn, this noise contribution can lead to a variation of the reference current on the basis of which the comparison of current and reading of the contents of the memory cells 2 is performed.

To overcome this drawback, the use of the noise-compensation stage 60 is envisaged, having the function of injecting on the same mirror voltage Vs a noise contribution opposite with respect to the one due to the variation in the reference voltage V(ref) so as to substantially eliminate its effects.

For this purpose, the noise-compensation stage 60 has a circuit structure that replicates the relevant portion of the second circuit branch 1b, and in particular comprises: a replicated mirror transistor 62 having the same electrical characteristics as the mirror transistor 12 (in general, denoted herein by the term "replicated" is a component that has the same electrical characteristics as the component of which it bears the same name), and having its gate terminal connected to the line set at the mirror voltage Vs (consequently connected to the gate terminal of the mirror transistor 12), its source terminal connected to ground via interposition of a first replicated enabling switch 63, and its drain terminal connected to a first internal node 64, which is at a replicated reference voltage, designated by V'(ref); in particular, the first replicated enabling switch 63 has its control terminal receiving the negated enabling signal $\overline{En}$. The intermediate node between the replicated mirror transistor 62 and the first replicated enabling switch 63 is moreover designated by 69' (the analogous node in the second circuit branch 1b of FIG. 2, set between the mirror transistor 12 and the first enabling switch 13, is designated by 69).

The noise-compensation stage 60 further comprises a replicated precharging transistor 65, connected between the first internal node 64 and a second internal node 66 by means of interposition of a fourth replicated enabling switch 67; the gate terminal of the replicated precharging transistor 65 receives the precharging voltage $V_{casc}$, whilst the control terminal of the fourth replicated enabling switch 67 receives the negated enabling signal $\overline{En}$.

The noise-compensation stage 60 further comprises a replicated comparison transistor 68, which is connected between the second internal node 66 and the line set at the internal supply voltage $V_{DD}$ and has its gate terminal connected to ground.

In use, upon switching-on of the sense-amplifier circuit 1 (i.e., upon switching of the enabling signal EN from the low value to the high value), the replicated reference voltage V'(ref), initially fixed at the ground value (since the replicated mirror transistor 62 and the first replicated enabling switch 63 are closed), shifts, rapidly charging to the internal supply voltage $V_{DD}$ (due to opening of the first replicated enabling switch 63 and closing of the fourth replicated enabling switch 67), consequently undergoing a variation opposite with respect to the reference voltage V(ref) on the reference-side input In_ref. In fact, the reference-side input In_ref, which is not initialized and has undergone charging to the internal supply voltage $V_{DD}$ (in particular, up to a voltage such as to cause turn-off of the precharging transistor 22b, on the gate terminal of which is the precharging voltage $V_{casc}$), rapidly discharges to the bitline voltage $V_{BL}$ upon switching-on of the circuit.

This variation is reflected, by capacitive coupling, on the gate terminal of the replicated mirror transistor 62 and hence on the mirror voltage Vs, in this way compensating for the analogous effect of capacitive coupling, and the associated noise contribution, determined by the reference voltage V(ref); in practice, the opposite variations of the reference voltage V(ref) and of the replicated reference voltage V'(ref) determine opposite contributions of charge on the line set at the mirror voltage Vs, which tend to compensate one another, as likewise the associated contributions of noise advantageously tend to compensate one another.

A similar reasoning may moreover be followed for the nodes 69' (in the noise-compensation stage 60) and 69 (in the second circuit branch 1b of the sense-amplifier circuit 1). In fact, at switching-on of the sense-amplifier circuit 1, also these nodes 69, 69' undergo, as emerges clearly from an analysis of the circuit, a voltage variation in an opposite sense, thus determining a noise contribution that tends advantageously to be compensated on the line set at the mirror voltage Vs.

The advantages that the sense-amplifier circuit described so far afford emerge clearly from the foregoing discussion.

In any case, it is again underlined that it is able to operate properly at very low voltages, equal to or lower than 1 V, with high performance in terms of switching speed and associated access time, which can be less than 35-40 ns (given by a read time of approximately 20-25 ns and a decoding and row- and column-selection time of approximately 10 ns) with capacitive loads in the region of 400 fF.

The sense-amplifier circuit 1 also has a high performance in terms of insensitivity to noise and accuracy (it manages in fact to discriminate a difference of current of even 1 μA without reading errors), considering also process spread and mismatches (as verified by statistical simulations).

The sense-amplifier circuit 1 enables, for its manufacturing, a saving in terms of silicon area and consumption levels given that it is entirely provided with LV transistors, and uses less complex biasing branches, fewer in number than in traditional solutions. In particular, the sense-amplifier circuit does not use dedicated current mirrors for precharging the bitline BL, but uses for the purpose the same current used for biasing the current mirror for comparison of the cell and reference currents, which, during the precharging step, is diverted towards the bitline.

Figure 9:
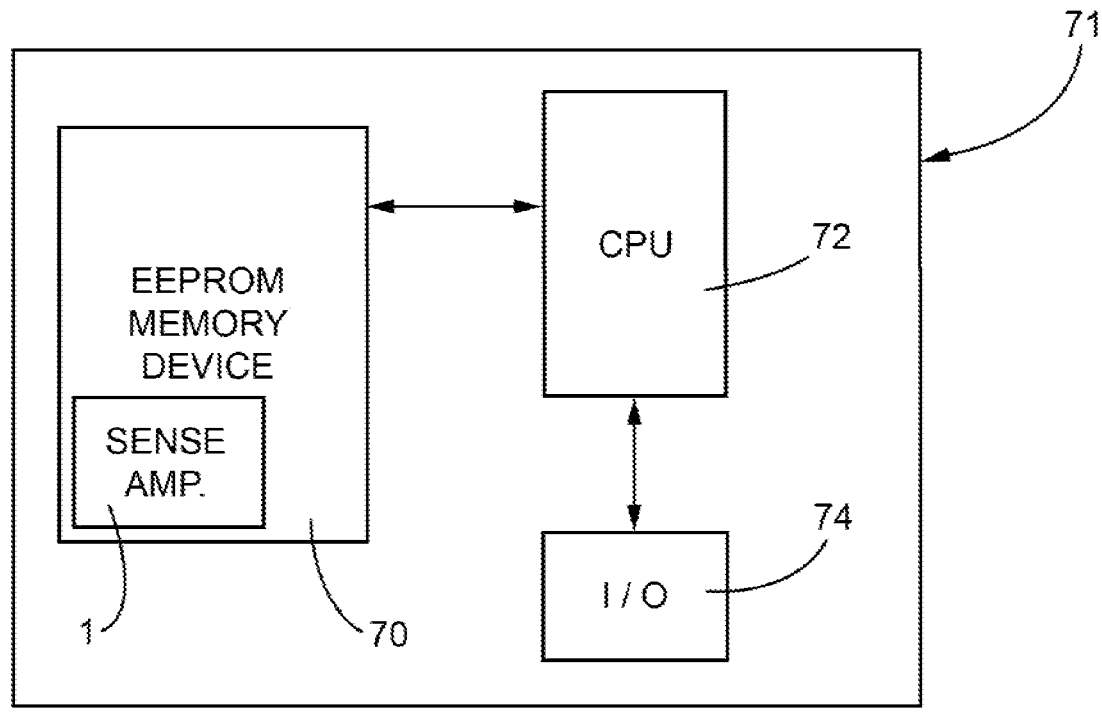
FIG. 9 is a general block diagram of an electronic device, in particular of the smart-card type, incorporating the sense-amplifier circuit of FIG. 2.

The characteristics listed previously render particularly advantageous the use of the sense-amplifier circuit 1 in an EEPROM device 70 for use in an electronic device, for example in a smartcard device 71, as illustrated in FIG. 9 in a simplified manner. As is known, smartcards are portable microelectronic devices usually having the dimensions of a common credit card, usually made of plastic material and incorporating a wide range of electronic subsystems that enable data processing and storage.

Smartcard device 71 comprises for example: the EEPROM device 70, designed to store data for a wide range of uses (for example, for financial or security applications); a processing unit (for example, a microprocessor) 72, operatively coupled to the EEPROM device 70 for programming/erasing/reading of the data contained therein; and an I/O interface unit 74, operatively coupled to the microprocessor 72 and configured so as to enable communication of the smartcard device 71 with the outside world, for example with an external processing apparatus.

Finally, it is clear that modifications and variations may be made to what has been described and illustrated herein, without thereby departing from the scope of the present disclosure.

In particular, it is evident that the sense-amplifier circuit 1 can be advantageously used in a wide range of storage devices, for example in Flash memories, NAND memories, or PCMs (Phase-Change Memories), and in general in all those applications where it is desired to carry out current sensing in conditions of low supply voltage.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A sense-amplifier circuit for a memory device, comprising:
   a first input configured to be connected to a bitline associated with a memory cell;
   a second input configured to be connected to a reference stage configured to supply a reference current;
   a comparison stage configured to perform a comparison between a cell current of the memory cell and said reference current and supply an output signal indicating a state of said memory cell, said comparison stage including a current mirror that includes a first comparison transistor and a second comparison transistor coupled respectively to a first differential output and to a second differential output, the first comparison transistor being configured to supply a biasing current;
   a precharging stage configured to supply, prior to said comparison, a precharging current to said bitline so as to charge a corresponding capacitance of the bitline, said precharging stage being configured to divert said biasing current towards said bitline as said precharging current, and to allow, during said comparison, passage of part of said biasing current towards said first differential output and enable operation of said current mirror, wherein said first comparison transistor is coupled between a first reference voltage line and a precharge node configured to be coupled electrically to said bitline and said precharging stage comprises a first precharging transistor coupled between said precharge node and said first input, and having a control terminal;
   an operational amplifier having first and second inputs and an output, the first input being configured to receive said desired bitline voltage and the output being electrically coupled to the control terminal of the first precharging transistor;
   a second precharging transistor coupled between a first reference voltage line and an internal node coupled to the second input of the operational amplifier, the second precharging transistor having a control terminal coupled to the output of said operational amplifier; and
   a biasing-current generator coupled to said internal node and configured to generate a current substantially equal to said reference current.

2. The circuit according to claim 1, wherein:
   said first comparison transistor has a control terminal coupled to said first differential output; and
   said current mirror comprises a current-steering transistor having a first conduction terminal coupled to said first differential output, a second conduction terminal selectively coupled to said precharge node and a control terminal configured to be set at a first biasing voltage such as to keep said current-steering transistor turned-off until said bitline attains a voltage that exceeds a first threshold.

3. The circuit according to claim 2, wherein said first reference voltage line is an internal supply voltage line of said sense-amplifier circuit and said first comparison transistor and current-steering transistor are P-channel MOSFETs; the circuit further comprising:
   a biasing circuit configured to set said first biasing voltage at a value equal to a supply voltage of said internal supply voltage line decreased by a second threshold.

4. The circuit according to claim 3, wherein said internal supply voltage line is configured to be set at a voltage less than 1.35 V.

5. The circuit according to claim 2, wherein said first precharging transistor is configured to be traversed by said precharging current, to operate in cascode configuration, and to bias said bitline to a desired bitline voltage.

6. The circuit according to claim 5, wherein:
   the second precharging transistor has electrical characteristics substantially the same as those of said first precharging transistor.

7. The circuit according to claim 2, further comprising:
   a first biasing transistor coupled between said first differential output and a second reference voltage line, and having control terminals configured to be set at a second biasing voltage.

8. The circuit according to claim 1, wherein said comparison stage further comprises a comparator having a first input and a second input coupled respectively to said first differential output and second differential output, and configured to compare voltages present on said first differential output and second differential output, so as to supply an output signal.

9. The circuit according claim 1, having a symmetrical structure comprising a first circuit branch, configured to be connected to said first input and defining said first differential output, and a second circuit branch, configured to be connected to said second input and defining said second differential output; said first circuit branch and second circuit branch having substantially a same circuit configuration.

10. The circuit according to claim 1, further comprising an enabling stage configured to enable switching-on of said sense-amplifier circuit, and to maintain, during an OFF state of said sense-amplifier circuit, said first differential output at a ground of said sense-amplifier circuit.

11. A memory device, comprising:
   a reference stage configured to supply a reference current;
   an array of memory cells; and
   a sense-amplifier circuit coupled to said memory cells and configured to read a state of each of the memory cells, the sense amplifier including:
      a first input configured to be connected to a bitline associated with a selected memory cell of the memory cells;
      a second input configured to be connected to the reference stage;
      a comparison stage configured to perform a comparison between a cell current of the selected memory cell and said reference current and supply an output signal indicating a state of said memory cell, said comparison stage including a current mirror that includes a first comparison transistor and a second comparison transistor coupled respectively to a first differential output and to a second differential output, the first comparison transistor being configured to supply a biasing current;
      a precharging stage configured to supply, prior to said comparison, a precharging current to said bitline so as to charge a corresponding capacitance of the bitline, said precharging stage being configured to divert said biasing current towards said bitline as said precharging current, and to allow, during said comparison, passage of part of said biasing current towards said first differential output and enable operation of said current mirror, wherein said reference stage comprises a first mirror transistor having a first conduction terminal, coupled to said second input, a second conduction terminal, and a control terminal coupled to a controlled voltage line; and
      a compensation stage configured to limit a noise on said controlled voltage line in response to a reference voltage on the second input undergoing a first variation.

12. The memory device according to claim 11, wherein said compensation stage comprises a second mirror transistor, with electrical characteristics substantially the same as those of said first mirror transistor, and having a control terminal, connected to said controlled voltage line, a second conduction terminal, and a first conduction terminal coupled to a reference node, the second mirror transistors being configured to undergo a second variation, substantially opposite to said first variation, in response to said reference voltage undergoing said first variation.

13. The memory device according to claim 12, wherein:
said reference stage includes a first enabling switch coupled between the second conduction terminal of the first mirror transistor and a ground line, and having a control terminal configured to receive a first enabling voltage; and
said compensation stage includes a second enabling switch coupled between the ground line and the second conduction terminal of said second mirror transistor, and having a control terminal configured to receive a second enabling signal, negated with respect to the first enabling signal.

14. An electronic apparatus comprising:
a control unit; and
a memory device coupled to the control unit and including:
a reference stage configured to supply a reference current;
an array of memory cells;
a sense-amplifier circuit coupled to said memory cells and configured to read a state of each of the memory cells, the sense amplifier including
a first input configured to be connected to a bitline associated with a selected memory cell of the memory cells;
a second input configured to be connected to the reference stage;
a comparison stage configured to perform a comparison between a cell current of the selected memory cell and said reference current and supply an output signal indicating a state of said memory cell, said comparison stage including a current mirror that includes a first comparison transistor and a second comparison transistor coupled respectively to a first differential output and to a second differential output, the first comparison transistor being configured to supply a biasing current; and
a precharging stage configured to supply, prior to said comparison, a precharging current to said bitline so as to charge a corresponding capacitance of the bitline, said precharging stage being configured to divert said biasing current towards said bitline as said precharging current, and to allow, during said comparison, passage of part of said biasing current towards said first differential output and enable operation of said current mirror, wherein said reference stage comprises a first mirror transistor having a first conduction terminal, coupled to said second input, a second conduction terminal, and a control terminal coupled to a controlled voltage line; and
a compensation stage configured to limit a noise on said controlled voltage line in response to a reference voltage on the second input undergoing a first variation.

15. The apparatus according to claim 14, wherein:
said first comparison transistor is coupled between a first reference voltage line and a precharge node configured to be coupled electrically to said bitline, and has a control terminal coupled to said first differential output; and
said precharging stage comprises a current-steering transistor having a first conduction terminal coupled to said first differential output, a second conduction terminal selectively coupled to said precharge node and a control terminal configured to be set at a first biasing voltage such as to keep said current-steering transistor turned-off until said bitline attains a voltage that exceeds a first threshold.

16. The apparatus according to claim 15, wherein said precharging stage comprises a first precharging transistor, selectively coupled between said precharge node and said bitline, having a control terminal coupled to a precharging voltage terminal, and configured to be traversed by said precharging current; to operate in cascode configuration, and to bias said bitline to a desired bitline voltage.

17. A sense-amplifier circuit for a memory device, comprising:
a reference stage configured to supply a reference current;
a first input configured to be connected to a bitline associated with a memory cell;
a second input couple to the reference stage and configured to receive the reference current;
a comparison stage configured to perform a comparison between a cell current of the memory cell and said reference current and supply an output signal indicating a state of said memory cell, said comparison stage including a current mirror that includes a first comparison transistor and a second comparison transistor coupled respectively to a first differential output and to a second differential output, the first comparison transistor being configured to supply a biasing current;
a precharging stage configured to supply, prior to said comparison, a precharging current to said bitline so as to charge a corresponding capacitance of the bitline, said precharging stage being configured to divert said biasing current towards said bitline as said precharging current, and to allow, during said comparison, passage of part of said biasing current towards said first differential output and enable operation of said current mirror, wherein said reference stage comprises a first mirror transistor having a first conduction terminal, coupled to said second input, a second conduction terminal, and a control terminal coupled to a controlled voltage line; and
a compensation stage configured to limit a noise on said controlled voltage line in response to a reference voltage on the second input undergoing a first variation.

18. The circuit according to claim 17, wherein said first comparison transistor is coupled between a first reference voltage line and a precharge node configured to be coupled electrically to said bitline and said precharging stage comprises a first precharging transistor coupled between said precharge node and said first input, and having a control terminal, the circuit further comprising:
an operational amplifier having first and second inputs and an output, the first input being configured to receive said desired bitline voltage and the output being electrically coupled to the control terminal of the first precharging transistor;
a second precharging transistor coupled between a first reference voltage line and an internal node coupled to the second input of the operational amplifier, the second precharging transistor having a control terminal coupled to the output of said operational amplifier; and a biasing-current generator coupled to said internal node and configured to generate a current substantially equal to said reference current.

19. The circuit according to claim 18, wherein:
said first comparison transistor has a control terminal coupled to said first differential output; and
said current mirror comprises a current-steering transistor having a first conduction terminal coupled to said first differential output, a second conduction terminal selectively coupled to said precharge node and a control terminal configured to be set at a first biasing voltage such as to keep said current-steering transistor turned-off until said bitline attains a voltage that exceeds a first threshold.

20. A memory device, comprising:
a reference stage configured to supply a reference current;
an array of memory cells; and
a sense-amplifier circuit coupled to said memory cells and configured to read a state of each of the memory cells, the sense amplifier including:
 a first input configured to be connected to a bitline associated with a selected memory cell of the memory cells;
 a second input configured to be connected to the reference stage;
 a comparison stage configured to perform a comparison between a cell current of the selected memory cell and said reference current and supply an output signal indicating a state of said memory cell, said comparison stage including a current mirror that includes a first comparison transistor and a second comparison transistor coupled respectively to a first differential output and to a second differential output, the first comparison transistor being configured to supply a biasing current;
 a precharging stage configured to supply, prior to said comparison, a precharging current to said bitline so as to charge a corresponding capacitance of the bitline, said precharging stage being configured to divert said biasing current towards said bitline as said precharging current, and to allow, during said comparison, passage of part of said biasing current towards said first differential output and enable operation of said current mirror, wherein said first comparison transistor is coupled between a first reference voltage line and a precharge node configured to be coupled electrically to said bitline and said precharging stage comprises a first precharging transistor coupled between said precharge node and said first input, and having a control terminal;
 an operational amplifier having first and second inputs and an output, the first input being configured to receive said desired bitline voltage and the output being electrically coupled to the control terminal of the first precharging transistor;
 a second precharging transistor coupled between a first reference voltage line and an internal node coupled to the second input of the operational amplifier, the second precharging transistor having a control terminal coupled to the output of said operational amplifier; and
 a biasing-current generator coupled to said internal node and configured to generate a current substantially equal to said reference current.

21. The memory device according to claim 20, wherein said reference stage comprises a first mirror transistor having a first conduction terminal, coupled to said second input, a second conduction terminal, and a control terminal coupled to a controlled voltage line; the memory device further comprising a compensation stage configured to limit a noise on said controlled voltage line in response to a reference voltage on the second input undergoing a first variation.

22. The memory device according to claim 21, wherein said compensation stage comprises a second mirror transistor, with electrical characteristics substantially the same as those of said first mirror transistor, and having a control terminal, connected to said controlled voltage line, a second conduction terminal, and a first conduction terminal coupled to a reference node, the second mirror transistors being configured to undergo a second variation, substantially opposite to said first variation, in response to said reference voltage undergoing said first variation.

23. An electronic apparatus comprising:
a control unit; and
a memory device coupled to the control unit and including:
 a reference stage configured to supply a reference current;
 an array of memory cells;
 a sense-amplifier circuit coupled to said memory cells and configured to read a state of each of the memory cells, the sense amplifier including
  a first input configured to be connected to a bitline associated with a selected memory cell of the memory cells;
  a second input configured to be connected to the reference stage;
  a comparison stage configured to perform a comparison between a cell current of the selected memory cell and said reference current and supply an output signal indicating a state of said memory cell, said comparison stage including a current mirror that includes a first comparison transistor and a second comparison transistor coupled respectively to a first differential output and to a second differential output, the first comparison transistor being configured to supply a biasing current;
 a precharging stage configured to supply, prior to said comparison, a precharging current to said bitline so as to charge a corresponding capacitance of the bitline, said precharging stage being configured to divert said biasing current towards said bitline as said precharging current, and to allow, during said comparison, passage of part of said biasing current towards said first differential output and enable operation of said current mirror, wherein said first comparison transistor is coupled between a first reference voltage line and a precharge node configured to be coupled electrically to said bitline and said precharging stage comprises a first precharging transistor coupled between said precharge node and said first input, and having a control terminal;
 an operational amplifier having first and second inputs and an output, the first input being configured to receive said desired bitline voltage and the output being electrically coupled to the control terminal of the first precharging transistor;
 a second precharging transistor coupled between a first reference voltage line and an internal node coupled to the second input of the operational amplifier, the second precharging transistor having a control terminal coupled to the output of said operational amplifier; and a biasing-current generator coupled to said internal node and configured to generate a current substantially equal to said reference current.

24. The apparatus according to claim 23, wherein:

said reference stage includes a first mirror transistor having a first conduction terminal, coupled to said second input, a second conduction terminal, and a control terminal coupled to a controlled voltage line; and the memory device includes a compensation stage configured to limit a noise on said controlled voltage line in response to a reference voltage on the second input undergoing a first variation.

25. The apparatus according to claim 24, wherein said compensation stage comprises a second mirror transistor, with electrical characteristics substantially the same as those of said first mirror transistor, and having a control terminal, connected to said controlled voltage line, a second conduction terminal, and a first conduction terminal coupled to a reference node, the second mirror transistors being configured to undergo a second variation, substantially opposite to said first variation, in response to said reference voltage undergoing said first variation.

* * * * *